(12) United States Patent
Danel et al.

(10) Patent No.: US 7,838,071 B2
(45) Date of Patent: Nov. 23, 2010

(54) CONTAINER-TREATMENT METHOD COMPRISING VACUUM PUMPING PHASES, AND MACHINE FOR IMPLEMENTING SAME

(75) Inventors: Laurent Danel, Octeville sur Mer (FR); Frédéric Lecomte, Octeville sur Mer (FR); Nicolas Chomel, Octeville sur Mer (FR)

(73) Assignee: Sidel Participations, Octeville-sur-Mer (FR)

(*) Notice: Subject to any disclaimer, the term of this patent is extended or adjusted under 35 U.S.C. 154(b) by 823 days.

(21) Appl. No.: 11/631,622

(22) PCT Filed: Jul. 5, 2005

(86) PCT No.: PCT/EP2005/053203

§ 371 (c)(1),
(2), (4) Date: Mar. 5, 2007

(87) PCT Pub. No.: WO2006/005698

PCT Pub. Date: Jan. 19, 2006

(65) Prior Publication Data

US 2007/0254097 A1    Nov. 1, 2007

(30) Foreign Application Priority Data

Jul. 8, 2004    (FR) .................................. 04 51474

(51) Int. Cl.
*B05D 7/22* (2006.01)
(52) U.S. Cl. ................. 427/238; 427/575; 427/230; 427/237
(58) Field of Classification Search .......... None
See application file for complete search history.

(56) References Cited

U.S. PATENT DOCUMENTS

| 5,578,132 | A | * | 11/1996 | Yamaga et al. | 118/724 |
| 5,677,010 | A | * | 10/1997 | Esser et al. | 427/489 |
| 5,690,745 | A | | 11/1997 | Gruenwald et al. | |
| 6,019,060 | A | * | 2/2000 | Lenz | 118/723 R |
| 2003/0086973 | A1 | * | 5/2003 | Sowden et al. | 424/474 |

FOREIGN PATENT DOCUMENTS

| DE | 43 18 086 | 12/1994 |
| EP | 0 773 167 | 5/1997 |
| WO | WO 95/22413 | 8/1995 |

* cited by examiner

*Primary Examiner*—Timothy H Meeks
*Assistant Examiner*—Joseph Miller, Jr.
(74) *Attorney, Agent, or Firm*—Young & Thompson

(57) ABSTRACT

A container-treatment method, of the type in which the container (12) is disposed inside a chamber (16) which defines a cavity (18) outside the container (12) and which is connected to a Vacuum pumping circuit (50), the interior of the container (12) being connected to the pumping circuit (50). The method includes a preliminary pumping step (E1) which is followed by a treatment step (E2). The preliminary step (E1) includes the following successive phases, namely: an external pumping phase (P1) which produces a drop in the pressure inside the cavity (18) only; and an internal pumping phase (P2) which produces a drop in the pressure inside the container (12) only. A machine used to implement the method is also disclosed.

6 Claims, 2 Drawing Sheets

CONTAINER-TREATMENT METHOD COMPRISING VACUUM PUMPING PHASES, AND MACHINE FOR IMPLEMENTING SAME

BACKGROUND OF THE INVENTION

The present invention relates to a method and a machine for treating containers made of plastic such as bottles made of polyethylene terephthalate (PET).

The present invention relates more particularly to a method for treating at least one container aimed at depositing an internal coating forming a barrier by means of a microwave plasma, in particular with a view to enabling oxido-sensitive liquids to be packaged in the container, of the type in which the container is disposed inside a hermetically sealed treatment chamber which delimits a cavity outside the container and which is connected to a vacuum pumping circuit by an external vacuum line, the interior of the container being connected to the pumping circuit by an internal vacuum line, of the type comprising a preliminary step during which the pumping circuit produces a pressure reduction inside the cavity to a set value called the final external value, and a pressure reduction in the container to a set value called the final internal value, the preliminary step being followed by a treatment step during which the final values are maintained inside the cavity and inside the container so as to enable the internal coating to be deposited inside the container.

During the treatment step, a precursor fluid (for example based on acetylene in the case of the production of a carbon-containing coating, or an organosilicon-containing compound in the case of a silica-based deposit) is injected into the container and subjected to the action of microwaves so that it passes to the plasma state and produces a barrier deposit on the internal walls of the container.

In order to produce this deposit, it is necessary to create the vacuum inside the container and inside the cavity, and to maintain this vacuum during the entire treatment step.

Generally, the desired pressure inside the container is approximately 0.1 mbar and the desired pressure inside the cavity is approximately 50 mbar.

It is known to carry out the preliminary step by simultaneously pumping from the cavity and from the container until the pressure inside the cavity reaches the final external value (approximately 50 mbar).

A closing device then hermetically seals the cavity so as to enable the pressure to fall inside the container to the final internal value which is lower than the final external value.

Simultaneous pumping from the cavity and from the container can present considerable problems since it is difficult to control the rate at which the pressure falls in each of the two elements.

Indeed, according in particular to the cross sections of the passage for air drawn out of the container and out of the cavity, and the shape of the container, the vacuum forms very rapidly in the container and more slowly in the cavity, so that during a particular length of time, the pressure difference between the interior of the container and the cavity reaches a value greater than the capacity of the container to resist mechanical crushing.

Generally, a PET container does not withstand more than a pressure reduction of 70 to 80 mbar.

The difference in pressure between the two elements therefore causes the container to collapse on itself which causes the container to be rejected and possibly causes the treatment machine to stop.

In order to avoid these problems, it is possible to increase the mechanical strength of the container, for example by increasing the thickness of the walls.

This solution is not satisfactory since it leads to an increase in the weight and cost of the container.

The mechanical strength of the container may also be increased by choosing a suitable shape.

This solution is not satisfactory either since it constitutes a technical constraint which prevents the external shape of the container from being freely chosen.

SUMMARY OF THE INVENTION

The invention aims in particular at remedying these disadvantages in a simple and economic manner.

With this aim, the invention provides a treatment method of the type previously described, characterized in that the preliminary step comprises successively:

an external pumping phase, during which the internal vacuum line is closed and the external vacuum line is open, the pumping circuit producing a pressure reduction only inside the cavity, to a set value which is greater than or equal to the final external value, and, an internal pumping phase, during which the external vacuum line is closed and the internal vacuum line is open, the pumping circuit producing a pressure reduction only inside the container, to the final internal value.

According to another feature of the invention, during the external pumping phase, the pumping circuit reduces the pressure inside the cavity to an intermediate value which is greater than the final external value, and an intermediate pumping phase is provided between the external pumping phase and the internal pumping phase, during which the external vacuum line and the internal vacuum line are opened simultaneously so that the pumping circuit reduces the pressure simultaneously inside the cavity and inside the container, until the pressure inside the cavity reaches the final external value.

The invention also provides a machine for treating bottles for implementing the method according to one of the preceding features, comprising at least one treatment station for at least one container, each treatment station comprising:

a treatment chamber which is provided so as to contain at least one container and which delimits, around the container, a cavity connected in a leakproof manner to an external vacuum line, and, an internal vacuum line connected in a leakproof manner to the interior of the container, of the type in which the external vacuum line and the internal vacuum line are connected to a common vacuum pumping circuit, the internal vacuum line communicating with the pumping circuit via a first controlled closing device and the external vacuum line communicating with the pumping circuit via a second controlled closing device, characterized in that the external vacuum line is directly connected to the pumping circuit without passing through the internal vacuum line, and in that the first closing device is controlled so as to enable the cavity and the container to be pumped independently of each other.

According to other features of the machine according to the invention:

at least one closing device consists of a valve controlled by a cam system;

at least one closing device consists of a solenoid valve.

BREIF DESCRIPTION OF THE DRAWING FIGURES

Other features and advantages of the invention will become apparent from reading the following detailed description, for an understanding of which reference will be made to the appended drawings in which.

DETAILED DESCRIPTION OF THE INVENTION

Figure 1:
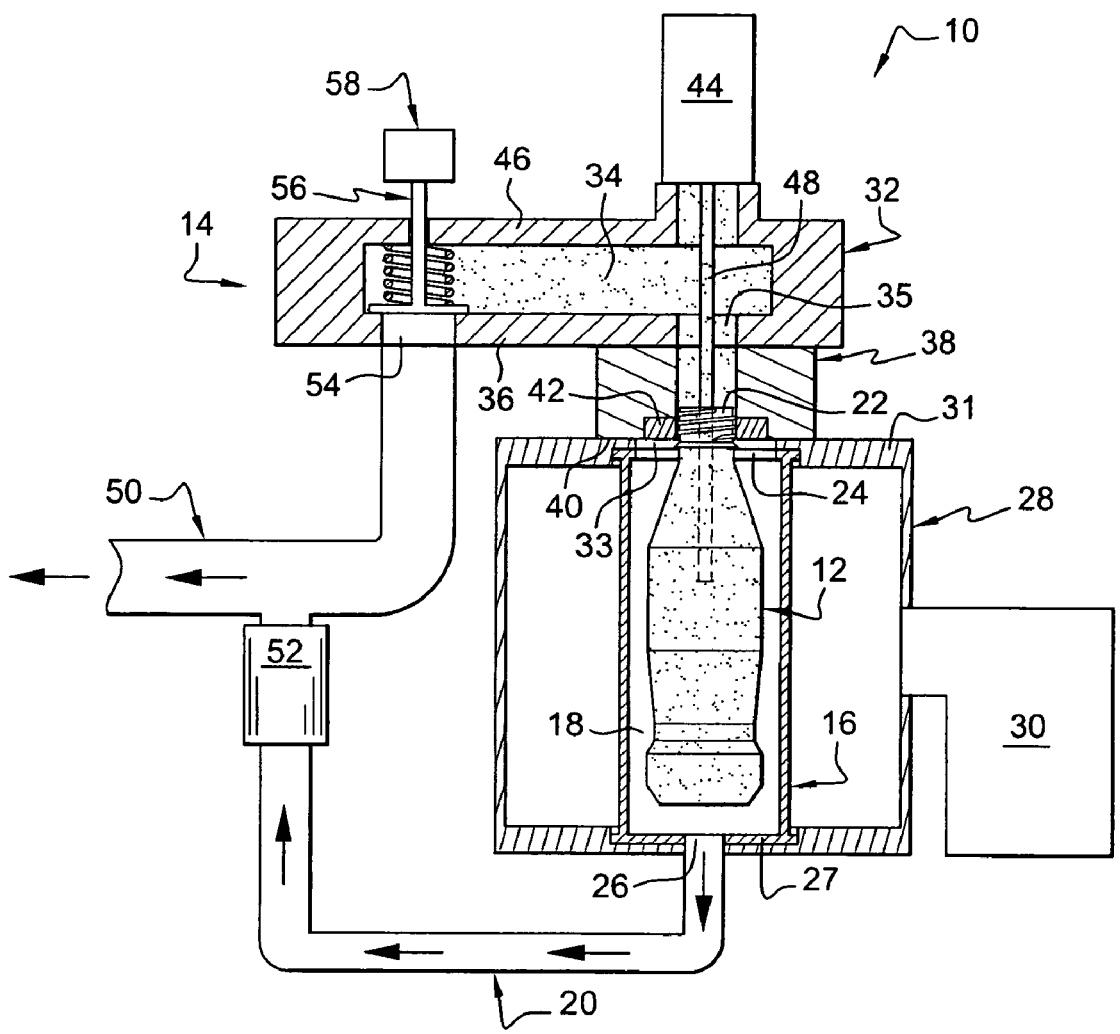
FIG. 1 is an axial sectional view which diagrammatically represents a treatment station of a machine produced according to the teachings of the invention and which illustrates an external pumping phase.
Figure 2:
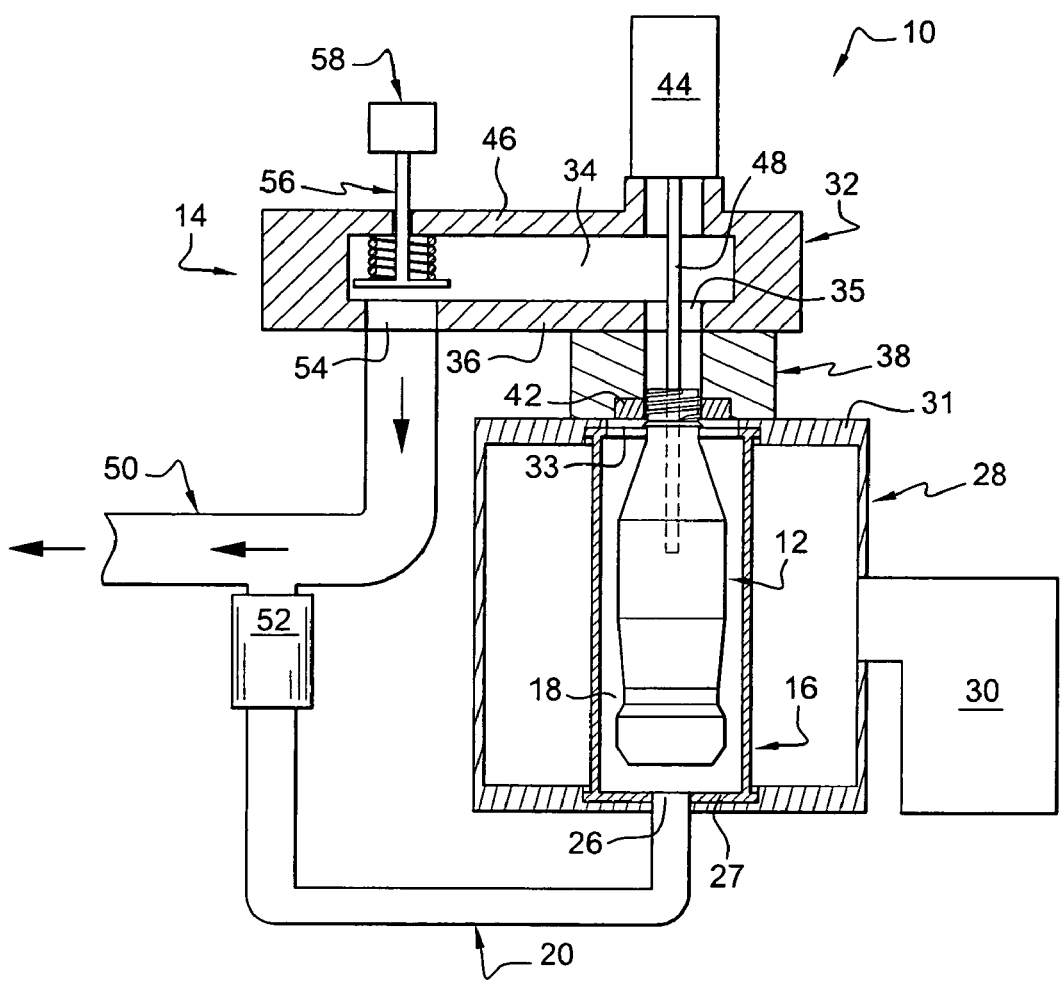
FIG. 2 is a similar view to that of FIG. 1 which illustrates an internal pumping phase.

FIGS. 1 and 2 diagrammatically represent a machine 10 for treating containers 12, consisting here of bottles 12, for implementing the method according to the invention.

The machine 10 can be produced in the form of a carousel comprising a series of identical treatment stations 14 which are distributed circumferentially around a main rotational axis.

FIGS. 1 and 2 partially represent a treatment station 14 provided for a bottle 12.

The treatment station 14 comprises a treatment chamber 16 which is designed to contain the bottle 12 and which delimits, around the bottle 12, a cavity 18 connected in a leakproof manner to an external vacuum line 20. The chamber 16 is made of a material transparent to microwaves, typically quartz.

The bottle 12 is here arranged vertically in the chamber 16 so that its neck 22 extends upward through a corresponding upper opening 24 of the chamber 16.

For the remainder of this description, a vertical axial direction is defined, in a nonlimiting manner, following the vertical axis of the bottle, and a transverse direction in relation to this axial direction.

Advantageously, the external vacuum line 20 emerges inside the cavity 18 through a lower opening 26 which is made in the lower transverse wall 27 of the chamber 16.

The chamber 16 is itself contained within a casing 28 which is associated with a microwave generator 30.

The upper axial end of the chamber 16 is in leakproof contact with the upper transverse wall 31 of the casing 28, so that the upper opening 24 of the chamber 16 is arranged facing an associated opening 33 provided in said upper transverse wall 31.

The treatment station 14 has a cover 32 which is designed to close the upper opening 24 of the chamber 16 in a hermetically sealed manner and which includes an internal vacuum line 34, or pumping chamber, connected in a leakproof manner to the interior of the bottle 12.

According to the embodiment shown here, the lower transverse wall 36 of the cover 32 is provided with a tubular-shaped pipe 38 which extends axially downward and which has a lower transverse annular surface 40 resting in a leakproof axial manner against the upper transverse wall 31 of the casing 28 so as to close the opening 33 of the casing 28 and the upper opening 24 of the chamber 16.

The pipe 38 provides a leakproof connection between the internal vacuum line 34 and the interior of the bottle 12 through a passage 35 provided in the lower transverse wall 36 of the cover 32.

The pipe 38 is provided with a holding device 42 which is designed for grasping the bottle 12 externally by its neck 22.

An injector 44 for precursor fluid is arranged on the upper transverse wall 46 of the cover 32. The injector 44 has an injection tube 48 which extends axially downward through the cover 32 and through the neck 22 of the bottle 12.

The external vacuum line 20 and the internal vacuum line 34 are connected to a common vacuum pumping circuit 50.

The pumping circuit 50 is connected to a vacuum pump (not shown).

According to the teachings of the invention, the external vacuum line 20 is directly connected to the pumping circuit 50 via a closing device 52, controlled for example by a solenoid valve.

The external vacuum line 20 is not connected to the internal vacuum line 34 of the cover 32.

The internal vacuum line 34 communicates with the pumping circuit 50 via a connecting orifice 54 which is made here in the lower transverse wall 36 of the cover 32.

Preferably, as illustrated in the figures, the connecting orifice 54 is provided with a controlled closing device 56 so as to enable the cavity 18 and the bottle 12 to be pumped independently of each other.

The controlled closing device 56 fitted to the connecting orifice 54 can be controlled by any suitable actuator 58 (a cam actuator or, preferably, an electromagnetic actuator, so that in this case the controlled closing device 56 consists of a solenoid valve).

A method for treating a container, consisting of a bottle, will now be described, according to the teachings of the invention and implemented by means of the machine 10 which has just been described.

The treatment method aims at depositing a coating called a barrier layer on the internal walls of the bottle 12 by means of a microwave plasma, in particular with a view to enabling oxido-sensitive liquids to be packaged in the bottle 12.

The treatment method comprises a preliminary step E1 during which the pumping circuit 50 produces a pressure reduction inside the cavity 18 to a set value called the final external value pFext and a pressure reduction inside the bottle 12 to a set value called the final internal value pFint which is lower than the final external value pFext.

The preliminary step E1 is followed by a treatment step E2 during which the final values pFext, pFint are maintained inside the cavity 18 and inside the bottle 12 so as to enable the internal coating to be deposited in the bottle 12.

According to the teachings of the invention, the preliminary step E1 comprises successively an external pumping phase P1, which is illustrated in FIG. 1, and an internal pumping phase P2, which is illustrated in FIG. 2.

During the external pumping phase P1, the closing device 56 is controlled in a closed position, as shown in FIG. 1, which closes the communication between the internal vacuum line 34 and the pumping circuit 50, and the closing device 52 is controlled in an open position which causes the external vacuum line 20 to communicate with the pumping circuit 50.

The pumping circuit 50 then produces a pressure reduction only in the cavity 18, to a final external value pFext capable of enabling the bottle 12 to be treated.

During the external pumping phase P1, the pressure inside the bottle 12 and inside the internal vacuum line 34 remains substantially constant.

During the internal pumping phase P2, the closing device 52 is controlled in a closed position, which closes the communication between the external vacuum line 20 and the pumping circuit 50, and the closing device 56 is controlled in an open position, as shown in FIG. 2, which causes the internal vacuum line 34 to communicate with the pumping circuit 50.

The pumping circuit 50 then produces a pressure reduction only inside the bottle 12, to a final internal value pFint, capable of enabling the plasma to be formed in order to carry out the treatment.

The treatment step E2 can then be put into operation.

During the treatment step, the pumping circuit 50 can continue to pump inside the bottle 12 so as to maintain the pressure at its final internal value pFint.

The final external value pFext is maintained in the cavity 18 by adequately sealing the chamber 16 and the external vacuum line 20.

It will be noted that the preliminary step E1 of the method according to the invention does not cause any time to be lost, compared with the operation of the method according to the prior art, since the final values pFext, pFint are obtained more rapidly by independent pumping from the cavity 18 and then from the bottle 12, rather than pumping simultaneously from the two elements.

According to a variant of the method according to the invention, during the external pumping phase P1, the pumping circuit 50 reduces the pressure inside the cavity 18 to an intermediate value pMext which is greater than the final external value pFext.

An intermediate pumping phase Pm is then put into operation, between the external pumping phase P1 and the internal pumping phase P2, during which the closing device 56 and the closing device 52 are open simultaneously, so that the external vacuum line 20 and the internal vacuum line 34 communicate simultaneously with the pumping circuit 50.

The intermediate pumping phase Pm is put into operation until the pressure inside the cavity 18 reaches the final external value pFext.

The closing device 52 is then closed and the internal pumping phase P2 is put into operation.

The invention is completely applicable to treatment machines which, instead of enabling a single container to be treated by the treatment station 14, would enable several containers to be treated.

In addition, instead of being made partially in the cover 32, and therefore in a movable structure, the internal vacuum line 34 could be in another part of the treatment station 14.

The invention claimed is:

1. A method for treating at least one container (12) aimed at depositing an internal coating forming a barrier by means of a microwave plasma, in particular with a view to enabling oxido-sensitive liquids to be packaged in the container (12), comprising:
    disposing the container (12) inside a hermetically sealed treatment chamber (16) which delimits a cavity (18) outside the container (12) and which is connected to a vacuum pumping circuit (50) by an external vacuum line (20), an interior of the container (12) being connected to the pumping circuit (50) by an internal vacuum line (34);
    performing a preliminary step (E1) during which the pumping circuit (50) produces a pressure reduction inside the cavity (18) to a set value called the final external value (pFext), and a pressure reduction inside the container (12) to a set value called the final internal value (pFint), which is lower than the final external value (pFext); and
    the preliminary step (E1) being followed by a treatment step (E2) during which the final values (pFext, pFint) are maintained inside the cavity (18) and inside the container (12) so as to enable the internal coating to be deposited inside the container (12),
    wherein the preliminary step (E1) comprises successively:
    an external pumping phase (P1), during which the internal vacuum line (34) is closed and the external vacuum line (20) is open, the pumping circuit (50) producing a pressure reduction only inside the cavity (18), until an intermediate value (pMext) which is greater than to the final external value (pFext),
    an intermediate pumping phase (Pm), between the external pumping phase (P1) and an internal pumping phase (P2), during which the external vacuum line (20) and the internal vacuum line (34) are opened simultaneously so that the pumping circuit (50) reduces the pressure simultaneously inside the cavity (18) and inside the container (12), until the pressure inside the cavity (18) reaches the final external value (pFext), and
    an internal pumping phase (P2), during which the external vacuum line (20) is closed and the internal vacuum line (34) is open, the pumping circuit (50) producing a pressure reduction only inside the container (12), to the final internal value (pFint).

2. The method as claimed in claim 1, wherein there is a treatment station (14) for the container (12), the treatment station (14) comprising:
    the treatment chamber (16) which is provided so as to contain the container (12) and which delimits, around the container (12), the cavity (18) connected in a leakproof manner to the external vacuum line (20); and
    the internal vacuum line (34) connected in a leakproof manner to the interior of the container (12), in which the external vacuum line (20) and the internal vacuum line (34) are connected to the common vacuum pumping circuit (50), the internal vacuum line (34) communicating with the pumping circuit (50) via a first controlled closing device (56) and the external vacuum line (20) communicating with the pumping circuit (50) via a second controlled closing device (52),
    wherein the external vacuum line (20) is directly connected to the pumping circuit (50) without passing through the internal vacuum line (34), and in that the first closing device (56) is controlled so as to enable the cavity (18) and the container (12) to be pumped independently of each other.

3. The method as claimed in claim 2, wherein at least one closing device (52, 56) is a valve controlled by a cam system (58).

4. The method as claimed in claim 2, characterized in that at least one closing device (52, 56) is a solenoid valve.

5. The method as claimed in claim 2, wherein the internal vacuum line (34) connected in a leakproof manner to the interior of the container is partially contained in a cover (32) designed to close the chamber (16) hermetically.

6. The method as claimed in claim 5, wherein the internal vacuum line (34) communicates with the pumping circuit (50) via a connecting orifice (54) made in the cover, and the first controlled closing device (56) is arranged in the connecting orifice (54) so as to close or free it.

* * * * *